(12) United States Patent
Ellis et al.

(10) Patent No.: US 6,233,817 B1
(45) Date of Patent: May 22, 2001

(54) METHOD OF FORMING THICK-FILM HYBRID CIRCUIT ON A METAL CIRCUIT BOARD

(75) Inventors: Marion Edmond Ellis, Kokomo; Frans Peter Lautzenhiser, Noblesville; Anthony John Stankavich; Dwadasi Hare Rama Sarma, both of Kokomo; Philip Harbaugh Bowles, Carmel, all of IN (US); Washington Morris Mobley, Phoenix, AZ (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/232,951

(22) Filed: Jan. 17, 1999

(51) Int. Cl.[7] ....................................................... H05K 3/30
(52) U.S. Cl. ................................ 29/832; 29/840; 29/846; 427/96
(58) Field of Search ................................ 427/96; 29/846, 29/832, 840

(56) References Cited

U.S. PATENT DOCUMENTS

| | | | |
|---|---|---|---|
| 4,163,072 | * | 7/1979 | Soos . |
| 4,650,923 | * | 3/1987 | Nishigaki . |
| 4,658,332 | * | 4/1987 | Baker et al. . |
| 4,694,573 | * | 9/1987 | Nishino et al. ........................ 29/846 |
| 4,794,048 | * | 12/1988 | Oboodi et al. . |
| 4,997,698 | * | 3/1991 | Oboodi et al. . |

* cited by examiner

*Primary Examiner*—Carl J. Arbes
(74) *Attorney, Agent, or Firm*—Jimmy L Funke

(57) ABSTRACT

A hybrid circuit structure that includes a metal substrate, an inorganic electrical insulator layer and at least one inorganic thick-film passive circuit element, such as a thick-film resistor, capacitor or conductor. An interface layer is provided between the insulator layer and the circuit element to prevent the detrimental effects of interlayer diffusion. The composition of the interface layer is selected to prevent the diffusion of constituents from the inorganic insulator layer, and to have a CTE near that of the circuit element to reduce thermal fatigue. As a result, the passive circuit element can be formed of essentially any one of a number of conventional inorganic thick-film materials that are widely used on alumina substrates.

19 Claims, 3 Drawing Sheets

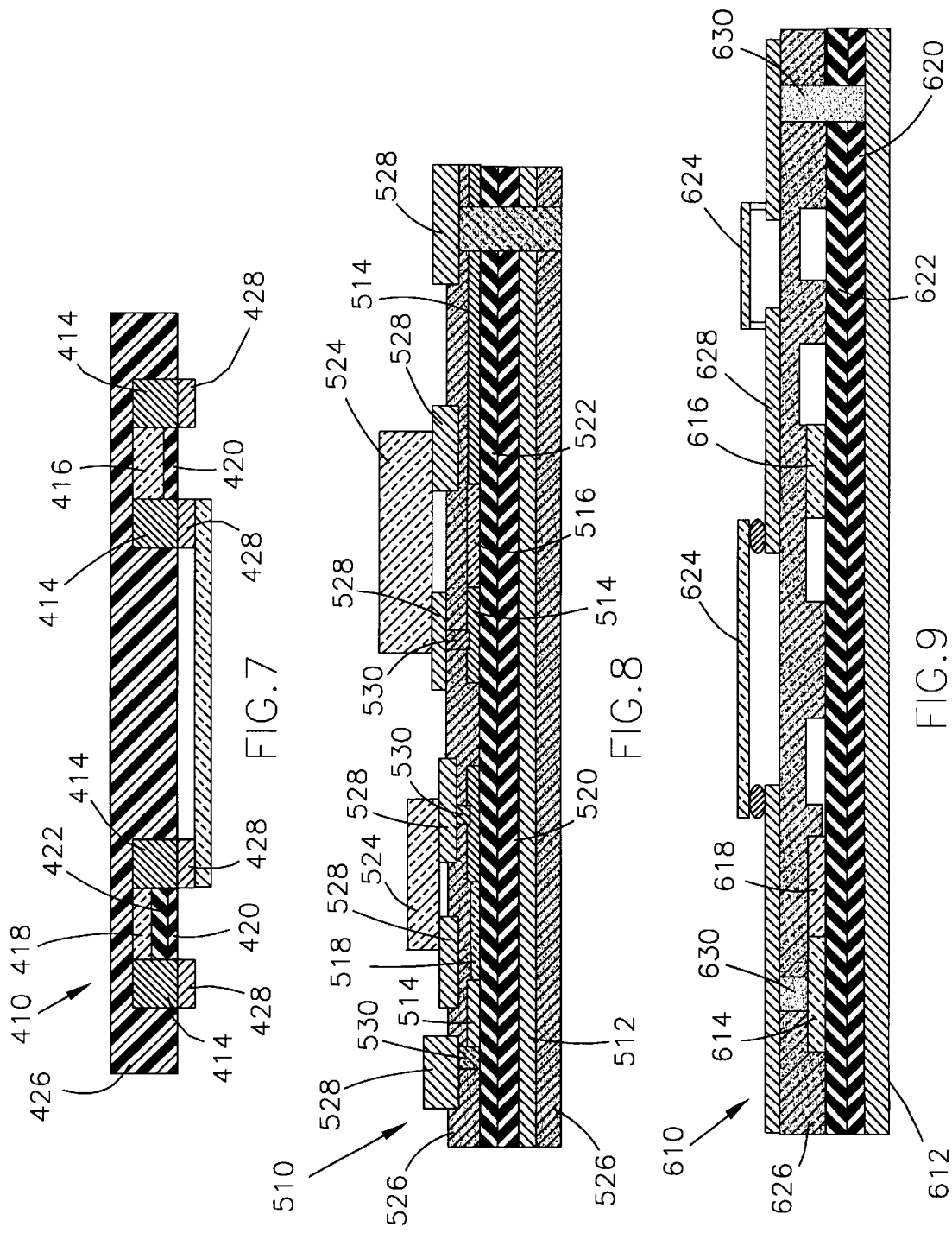

METHOD OF FORMING THICK-FILM HYBRID CIRCUIT ON A METAL CIRCUIT BOARD

FIELD OF THE INVENTION

The present invention generally relates to thick-film materials and processes. More particularly, this invention relates to a thick-film hybrid circuit structure processed on a metal substrate, wherein the circuit structure includes inorganic thick-film passive circuit elements, a dielectric insulator layer that electrically insulates the passive devices from the steel substrate, and a barrier layer that prevents diffusion from the insulator layer into the circuit elements.

BACKGROUND OF THE INVENTION

Insulated metal substrates have been used in the fabrication of electronic circuits to yield circuit board structures with thermal resistances lower than circuits formed on conventional alumina substrates. Typical metal substrate materials include steel, clad metal and aluminum alloys. Electrical insulation of metal substrates has been achieved using inorganic insulator coatings formed from such materials as porcelain enamels and glass dielectrics, and organic insulator coatings formed from such materials as KAPTON®, TEFLON®, acrylics, epoxies and phenolic polymers filled with ceramics.

Porcelain insulator coatings are fired at temperatures sufficiently high (e.g., about 600° C. to about 900° C.) to allow printing and firing of inorganic thick-film resistive, dielectric and conductive inks to form thick-film passive circuit devices and conductors. While effective in electrically insulating thick-film circuit elements from metal substrates, porcelain enamel coatings have coefficients of thermal expansion (CTEs) higher than conventional inorganic thick-film materials, which if not compensated for promotes thermal fatigue. (As used herein, the term "conventional inorganic thick-film materials" are those resistive, dielectric and conductive materials designed for use on alumina (e.g., 96%) substrates and characterized by sufficient process insensitivity, consistency, predictability and power dissipation to be suitable for high-volume applications, such as automotive electronic applications. Conventional inorganic thick-film resistive materials are also understood by this definition to have sheet resistances of up to at least 100 kilo-ohms/square.) To avoid a CTE mismatch, inorganic thick-film circuit elements formed on porcelain insulator coatings have been specifically formulated to be compatible with the particular porcelain material used for the insulator coating. Materials for inorganic thick-film circuit elements formed on porcelain insulator coatings must also tolerate the diffusion of constituents from these coatings, which would otherwise cause undesirable changes in the electrical and physical properties of the circuit elements. In other words, "nonconventional" inorganic thick-film materials must be used with porcelain insulator coatings, often yielding circuit elements whose process insensitivity, consistency, predictability and power dissipation are not as good as conventional inorganic thick-film materials.

Thick-film materials for circuit elements formed on glass dielectric insulator coatings must also be specifically formulated to be compatible with the particular glass material in order to tolerate diffusion of constituents from the insulator coatings. While glass dielectric insulator coatings may contain many of the same constituents present in an inorganic thick-film circuit element, the relative proportions of a given constituent may be such that interdiffusion during firing of the circuit element creates intermediate phases whose impact on the circuit element depends on the degree of diffusion and the proportion that the newly created phases assume relative to the total composition of the circuit element. It is not unusual for these new phases to alter the softening point, melting point, wetting characteristics and CTE of the circuit element, which are primary determinants of the electrical properties of thick-film passive circuit elements, including such properties as the sheet resistivity, temperature coefficient of resistance (TCR) and stability of a thick-film resistor.

In view of the above complications, it can be appreciated that circuit elements formed of conventional inorganic thick-film materials (as defined herein) have not been used on metal substrates. Instead, inorganic thick-film circuit elements on metal substrates have generally been limited to the use of specially formulated inorganic thick-film materials, and for such niche applications as camera flash bars and teapot heaters.

A significant limitation for the use of organic insulator coatings on metal substrates is their limited temperature capability, typically about 400° C. Consequently, circuit elements formed of conventional inorganic thick-film materials that require firing at 600° C. or higher are incompatible with metal substrates having an organic insulator coating. Instead, polymer thick-film (PTF) materials that cure at temperatures of up to about 300° C. have been used to form the thick-film resistive masses and capacitive dielectrics of passive thick-film circuit elements. However, a significant drawback to this approach is the lower stability of PTF resistors as compared to inorganic thick-film resistors. For example, whereas inorganic thick-film resistors may exhibit a permanent resistance change of less than 1% when subjected to a harsh environment (e.g., 1000 hours at 150° C.), a PTF resistor may exhibit a change of about 2% when subjected to the same environment. NiP is a "nonconventional" inorganic resistive material that is compatible with organic insulator coatings, but has a sheet resistance capability of only up to about 250 ohms/square, necessitating complex and/or large resistor designs to achieve suitable resistances for many applications. Finally, ruthenium-based thick-film materials taught by U.S. patent application Ser. No. 09/105,611 to Bowles et al. and U.S. patent application Ser. No. 09/178,758 to Ellis et al. are other examples of "nonconventional" inorganic thick-film materials that are compatible with organic insulator coatings for metal substrates.

In view of the above, it can be appreciated that the prior art lacks the ability to form thick-film resistors, capacitors and conductors on metal substrates from conventional inorganic thick-film materials. However, such a capability would be very desirable from the standpoint of processing, performance and reliability of a thick-film hybrid circuit.

SUMMARY OF THE INVENTION

The present invention provides a hybrid circuit structure that includes a metal substrate, an inorganic electrical insulator layer and one or more inorganic thick-film passive circuit elements, such as thick-film resistors, capacitor and conductors. For purposes of ruggedness and compatibility with a wide variety of environments, the metal substrate is preferably formed of a steel, most preferably a stainless steel such as an AISI Type 300 or 400 Series. The insulator is preferably formed of a mixture of metal oxides to electrically insulate the circuit elements from the metal substrate.

To prevent the detrimental effects of diffusion from the insulator layer that would degrade the circuit elements, the present invention provides an interface layer between the insulator layer and the circuit elements. In addition to preventing the diffusion of constituents from the insulator layer into the circuit elements, the composition of the interface layer is selected to have a CTE near that of the circuit elements to reduce thermal fatigue. As a result, the passive circuit elements can be formed of essentially any one of a number of conventional inorganic thick-film materials that are widely used on alumina substrates.

To successfully perform its role as a diffusion barrier, the interface layer is formulated to contain particulate oxides in a dielectric glass matrix. Preferred particulate oxides are those of aluminum, silicon, zinc and zirconium and optionally titanium, and a preferred matrix material is a barium aluminum borosilicate glass. The matrix material may also contain oxides of titanium, copper, manganese, cobalt, calcium and strontium. According to this invention, inorganic thick-film resistors separated from an inorganic insulator layer by the interface layer can have sheet resistivities essentially identical to the same thick-film resistive materials on alumina substrates, and exhibit minimal change in sheet resistivity following firing and during subsequent thermal exposures. Conventional thick-film conductors and capacitors printed and fired on the interface layer of this invention also exhibit properties comparable to the same thick-film materials on alumina substrates.

In view of the above, the present invention provides for a hybrid thick-film circuit structure that combines a thermally-conductive metal substrate and conventional thick-film technology, and avoids compositional interactions between thick-film circuit elements and an inorganic insulator coating required to insulate the elements from the metal substrate, so as to enable the use of conventional inorganic thick-film materials for the circuit elements. Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which:

FIGS. 4 through 9 are cross-sectional views of circuit structures in accordance with different embodiments of this invention.

DETAILED DESCRIPTION OF THE INVENTION

Figure 1:
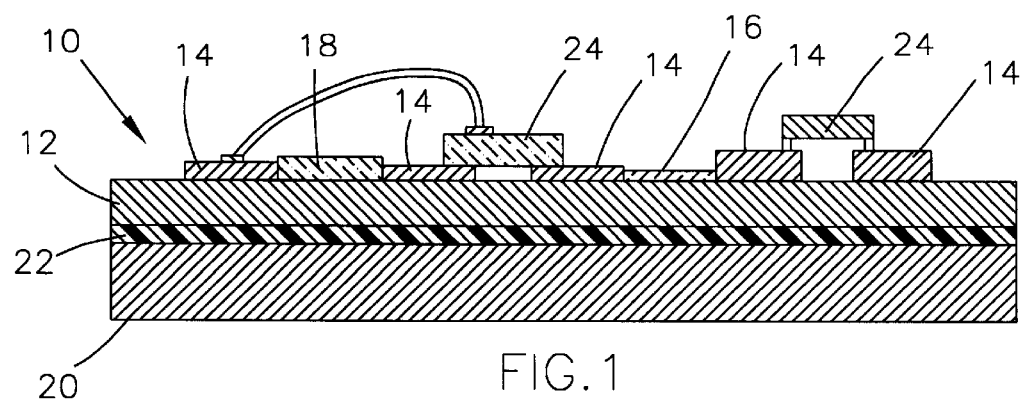
FIG. 1 is a cross-sectional view of a prior art hybrid thick-film circuit structure with an alumina substrate.

FIG. 1 represents a hybrid circuit structure 10 in accordance with the prior art. The circuit structure 10 includes an alumina substrate 12 on which are printed and fired inorganic thick-film conductors 14, a thick-film resistor 16 and a thick-film capacitor 18. As thick films, each layer of these passive circuit elements 14, 16 and 18 is about 25 μm (about one mil) or more in thickness, and formed by depositing an appropriate thick-film paste or ink using a printing technique or similar process. Consequently, the circuit elements 14, 16 and 18 are distinguishable from thin-film circuit structures. The alumina substrate 12 is shown as being bonded to an aluminum backplate 20 with an adhesive 22 to promote the conduction of heat from circuit components 24 mounted to the circuit structure 10.

Figure 2:
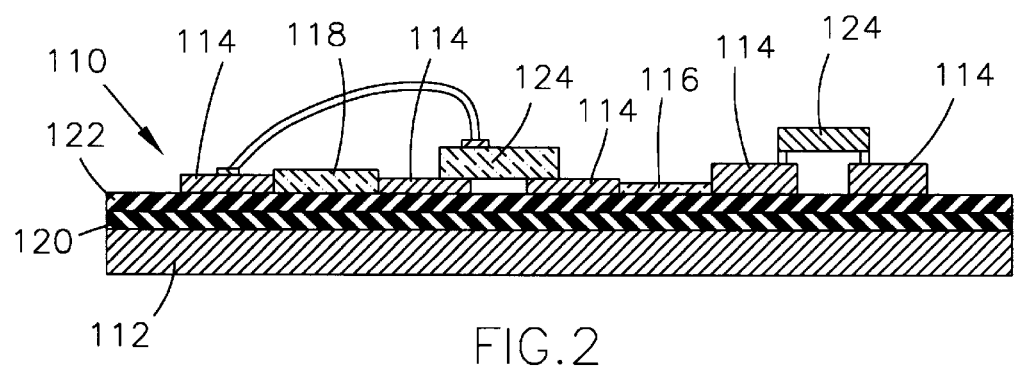
FIG. 2 is a cross-sectional view of a hybrid thick-film circuit structure that includes a metal substrate and an interface layer in accordance with this invention.

Improved thermal management of circuit components of a hybrid circuit structure 110 is achieved with this invention in comparison to the structure 10 shown in FIG. 1 by the use of a metal substrate 112, as represented in FIG. 2. The substrate 112 is preferably formed of a steel alloy, and preferably stainless steel in order to achieve a suitable level of corrosion resistance. While various grades of steel could be used, preferred alloys are AISI Type 300 and 400 Series alloys, with Types 304, 316, 404, 430, 430 S17 and 444 being preferred. However, it is within the scope of this invention to use other stainless steels, as well as carbon and galvanized steels and other metals.

In the hybrid circuit structure 110 shown in FIG. 2, thick-film conductors 114, a thick-film resistor 116 and a thick-film capacitor 118 are printed and fired on an insulator coating 120 that electrically insulates these passive thick-film elements 114, 116 and 118 and several active circuit components 124 from the substrate 112. The insulator coating 120 may be a glass dielectric material of a type known in the art, though it is foreseeable that other materials could be used. As a key aspect of this invention, the passive thick-film elements 114, 116 and 118 are printed and fired from inorganic thick-film inks of the type conventionally printed and fired on alumina substrates (e.g., the substrate 12 of FIG. 1), which render the elements 114, 116 and 118 more stable than if they were formed of organic thick-film materials or inorganic thick-film materials specifically formulated to be compatible with the insulator coating 120.

According to the invention, suitable inks for the passive circuit elements 114, 116 and 118 are those known and commercially available for use on circuit structures with alumina substrates, e.g., the circuit structure 10 of FIG. 1. For example, a commercially available thick-film resistor ink suitable for the thick-film resistor 116 is available under the name "S1XO Series" from E. I. DuPont de Nemours and Company, Inc., of Wilmington, Del., while suitable thick-film conductor inks for the conductors 114 include a silver-palladium composition identified as 7484 and also commercially available from DuPont. Thick-film printing processes for depositing the inks and the thermal processing required to fire such inks are well known in the art, and therefore will not be discussed here in any detail.

The insulator coating 120 is printed and fired from an inorganic thick-film dielectric ink using deposition and thermal processing techniques similar to that form the circuit elements 114, 116 and 118. Preferred compositions for the insulator coating 120 are glass dielectrics containing one or more bonding agents and a mixture of particulate metal oxides that, when the ink for the insulator coating 120 is fired, provide for a coefficient of thermal expansion (CTE) that approximately equals that of the metal substrate 112, e.g., about 10 ppm/° C. Suitable bonding agents are those that are noncorrosive to the metal substrate 112. Preferred metal oxides for the insulator coating 120 are oxides of zirconium, titanium, copper, manganese, cobalt, zinc, calcium and strontium. Other possible materials that could be substituted for the metal oxides include porcelain, quartz, $SiO_2$, flint as a source of $SiO_2$, boric acid as a source for boron oxide, and carbonates as sources for metal oxides. A particularly suitable ink composition for the insulator coating 120 is ESL D-4914, which is commercially available from Electro-Science.

Of significance to this invention is that thick-film glass dielectric materials used to form the insulator coating 120 contain glass frits composed of metal oxides that tend to diffuse into the inorganic thick-film circuit elements 114, 116 and 118 during firing. The detrimental effect of the diffusion of metal oxides from the frit component of the insulating coating 120 can be explained in reference to the thick-film resistor 116. Resistive thick-film inks suitable for forming the resistor 116 generally have sheet resistivities of about 100 ohms/square to about 100 kilo-ohms/square. The sensitivity of a thick-film resistor to temperature is indicated by its temperature coefficient of resistance (TCR), as measured in parts per million per ° C. (ppm/° C.). Thick-film resistors can typically be calibrated to have a TCR in the range of about ±100 to about ±50 ppm/° C. when measured across a temperature range of –55° C. and 125° C., which are standard temperature extremes used by the industry to evaluate the electrical characteristics of thick-film resistors. However, diffusion of constituents from the inorganic insulator coating 120 into the inorganic thick-film resistor 116 can permanently alter its electrical resistance by changing its sheet resistivity. The electrical properties of the thick-film conductors 114 and capacitor 118 are also subject to degradation if diffusion from the insulator coating 112 occurs.

The present invention prevents interlayer diffusion into the circuit elements 114, 116 and 118 with an interface layer 122 that preferably contains a dispersion of particulate ceramic materials in a glass matrix. Preferred materials for the particulate material include alumina ($Al_2O_3$), silica ($SiO_2$) zinc oxide (ZnO) and zirconia ($ZrO_2$), with an optional particulate material being titanium dioxide ($TiO_2$). Preferred matrix materials include barium oxide (BaO), silica ($SiO_2$), alumina ($Al_2O_3$) and boric oxide ($B_2O_3$), with a preferred matrix being a barium aluminum borosilicate glass. Optional matrix materials include oxides of titanium, copper, manganese, cobalt, calcium and strontium. The interface layer 122 preferably contains, in weight percent, about 25% to about 50% of the particulate material, with the balance being the matrix material. According to this invention, the high concentration of the particulate ceramic materials, particularly alumina, in the interface layer 122, inhibits the diffusion of constituents from the insulator coating 120 during firing by increasing the melting point of the insulator coating glass at the interface with the interface layer 122, forming a barrier such that the constituents of the coating 120 most likely to degrade the circuit elements 114, 116 and 118 cannot diffuse or move into the interface layer surface that will be contacted by the circuit elements 114, 116 and 118 during subsequent processing. Also according to this invention, alumina present in the interface layer 122 causes the interface layer 122 to form a dense alumina glass-ceramic during firing that becomes, from the perspective of the circuit elements 114, 116 and 118, the alumina substrate for which they were designed. To promote the effectiveness of the interface layer 122, the alumina particles should be relatively fine, yet not so fine that they dissolve in the glass matrix of the interface layer 122 during firing.

Similar to other thick-film inks used to form the circuit elements 114, 116 and 118 and the insulating coating 120, the thick-film ink from which the interface layer 122 is printed and fired preferably contains an organic media that burns off during firing. A suitable organic media is a terpineol/ethyl cellulose solution, though other vehicles could be used such as butyl carbitol acetate/acrylic resin and combinations of propylene/dipropylene glycol phenyl ether, diethylene glycol dibutyl ether, dimethyl phthalate and trimethylpentanediol monoisobutyrate with ethyl cellulose could be used. A particularly suitable ink composition for the interface layer 122 is commercially available under the name QM44 from DuPont.

According to this invention, the interface layer 122 inhibits diffusion of metal oxides from the frit component of the insulator coating 120 into the inorganic thick-film circuit elements 114, 116 and 118, while also being compatible with the materials for the insulator coating 120 and the circuit elements 114, 116 and 118 in terms of CTE. The CTE of the interface layer 122 is preferably approximately equal to that of the circuit elements 114, 116 and 118, e.g., about 6.7 ppm/° C. As a result, the presence of the interface layer 122 enables conventional inorganic thick-film materials (as defined herein) to be used with a metal substrate, a combination that has never been achieved before.

During investigations that led to the present invention, AISI Type 430 stainless steel and 96% alumina coupons were used as comparative test substrates. On each stainless steel coupon, an insulator coating (e.g., coating 120 in FIG. 2) was formed by printing ESL D-4914 dielectric ink, while a dielectric layer of QM44 was printed on the alumina substrates for comparative testing. Each layer was printed with a 230 mesh screen of 1.4 mil (about 36 $\mu$m) diameter wire and 0.9 mil (about 22 to 23 $\mu$m) emulsion thickness. Each of these inks was dried and fired at a peak temperature of about 850° C. for about ten minutes. A second dielectric layer of the QM44 was then printed, dried and fired on each of the coupons using the same procedure, so that each of the stainless steel coupons had an insulator coating 120 of ESL D-4914 and an interface layer 122 of QM44. Thick-film conductors were then formed by printing DuPont 7484 ink composition on the QM44 layers of the alumina and stainless steel coupons with a 325 mesh screen of about 1.1 mil (about 28 $\mu$m) diameter wire and about 0.5 mil (about 12.5 $\mu$m) emulsion thickness. The inks were dried and fired at about 850° C. for about ten minutes. Thick-film resistors were then formed on each of the specimens by printing, drying and firing the S1XO Series resistor ink in the same manner as was done for the conductors. Each substrate specimen was printed with a resistor having a targeted sheet resistivity of either 100, 1K, 10K or 100K ohms/square.

The resulting inorganic thick-film resistors were then evaluated for sheet resistivity and TCR. Sheet resistivities (Rs) for all specimens were substantially identical for the entire range of sheet resistivities tested, which is an object of this invention. TCR (in ppm/° C.) for each specimen was evaluated at about –40° C. ("CTCR") and about +125° C. ("HTCR"), the results of which are summarized below in Table I. In Table I, "SS" stands for "stainless steel."

TABLE I

| Substrate | Rs | CTCR | HTCR |
|---|---|---|---|
| Alumina | 100 | 38 | 97 |
| Alumina | 1K | 47 | 74 |
| Alumina | 10K | –35 | 24 |
| Alumina | 100K | –76 | 19 |
| SS | 100 | 89 | 132 |
| SS | 1K | 98 | 115 |
| SS | 10K | 42 | 105 |
| SS | 100K | 20 | 109 |

The differences between the TCR values of the resistorse formed on the alumina and steel substrates were explained by the large CTE difference between alumina (having a CTE range of about 6.54 ppm/° C.) and stainless steels (having a CTE range of about 10 ppm/° C. to about 18 ppm/° C., depending on the type of steel). The slightly more positive TCRs on the stainless steel substrates could be easily shifted to within ±100 ppm/° C. using standard TCR shifters.

Each specimen was then evaluated for change in resistance as a result of environmental testing. The specimens were subjected to a 1000-hour exposure at 150° C. ("SOAK"), a 1000-hour exposure to 85%/85° C. humidity ("HUMIDITY"), or 1000 thermal cycles between about −50° C. and 150° C. ("CYCLE"). The results from these tests are summarized as percent change in Table II below.

TABLE II

| Substrate | Rs | SOAK | HUMIDITY | CYCLE |
|---|---|---|---|---|
| Alumina | 100 | 0.1% | 0.2% | 0.0% |
| Alurnina | 1K | 0.1 | 0.2 | 0.0 |
| Alumina | 10K | 0.1 | 0.7 | 0.1 |
| Alumina | 100K | 0.2 | 0.9 | 0.1 |
| SS | 100 | 0.1 | 0.1 | 0.1 |
| SS | 1K | 0.0 | 0.2 | 0.0 |
| SS | 10K | 0.1 | 0.7 | 0.1 |
| SS | 100K | 0.1 | 0.7 | 0.1 |

The above data evidence that, under equivalent environmental conditions, the resistance change of a thick-film resistor on a stainless steel substrate protected in accordance with this invention is essentially the same as for an identical thick-film resistor on alumina. This characteristic is another object of this invention.

Figure 3:
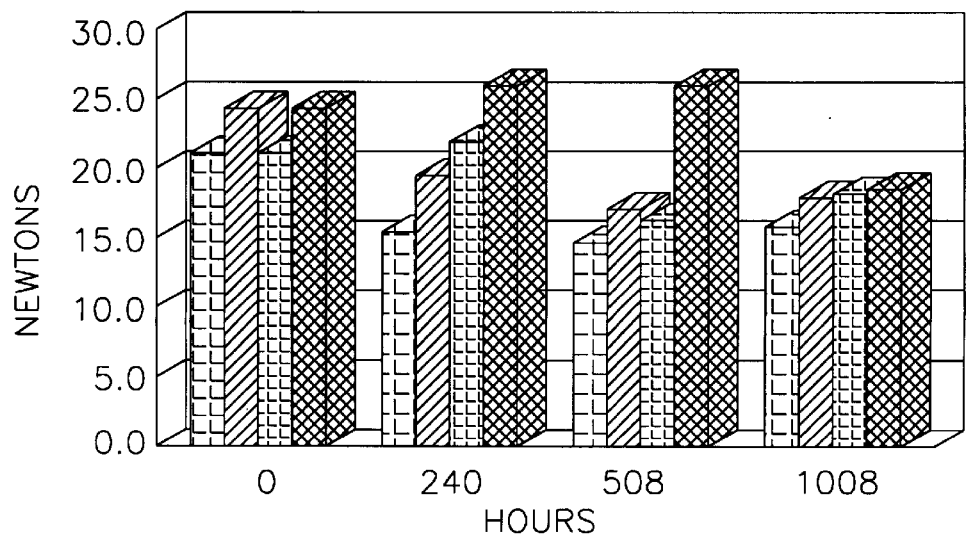
FIG. 3 is a graph comparing the results of solder adhesion testing performed on hybrid thick-film circuit structures prepared in accordance with this invention and the prior art.

During a second investigation, AISI Type 430 stainless steel and 96% alumina coupons were again processed to have insulator coatings, interface layers and conductors using the same screen parameters described above. Wire leads were then affixed to the conductors of each specimen with 60 Sn/40 Pb solder alloy. Some of the specimens were then immediately tested for solder adhesion, while others were tested for solder adhesion after exposures of about 204, 508 or 1008 hours to either 150° C. or 85%/85° C. humidity. The results of this test are summarized in FIG. 3, and evidence the excellent adhesion of the stainless steel specimens as compared to the alumina specimens.

Finally, a voltage regulator circuit was then fabricated on an AISI Type 430 stainless steel substrate to compare its thermal resistance to an identical circuit formed on a conventional alumina substrate with a 0.065 inch (about 1.6 mm) thick aluminum backplate, similar to the prior art hybrid structure depicted in FIG. 1. The stainless steel substrate was approximately 0.125 inch (about 3 mm) thick. On the stainless steel substrate, an insulator coating 120 was formed by printing ESL D-4914 dielectric ink with a 230 mesh screen of 1.4 mil (about 36 μm) diameter wire and 0.9 mil (about 23 μm) emulsion thickness. The ink was then dried and fired at a peak temperature of about 850° C. for about ten minutes. An interface layer 122 of QM44 was then printed, dried and fired on the insulator coating 120 using the same procedure. Processing of the stainless steel then proceeded in a conventional manner, with the printing of thick-film conductors, resistors and capacitors and the mounting of circuit components, such as flip chips and surface-mount devices (SMD), to yield a structure similar to that represented in FIG. 2.

Finite element analysis (FEA) modeling of the voltage regulator circuit was then performed and compared to the identical voltage regulator circuit on an alumina substrate. The results of this analysis evidenced lower thermal resistances on the order of about 25% to about 100% for the circuit formed on the stainless steel substrate, depending on the number of conductor layers included in the models.

Based on the above results, it was concluded that circuit elements formed from conventional inorganic thick-film materials are able to perform on a stainless steel substrate similar to identical circuit elements formed from the same materials on a conventional alumina substrate. Also demonstrated was a hybrid circuit on stainless steel (e.g., FIG. 2) that was electronically equivalent to what is conventionally formed on 96% alumina substrates. The hybrid circuit on stainless steel evidenced the reduced thermal resistance that can be achieved with this invention in comparison to conventional alumina substrates equipped with aluminum backplates.

Figure 4:
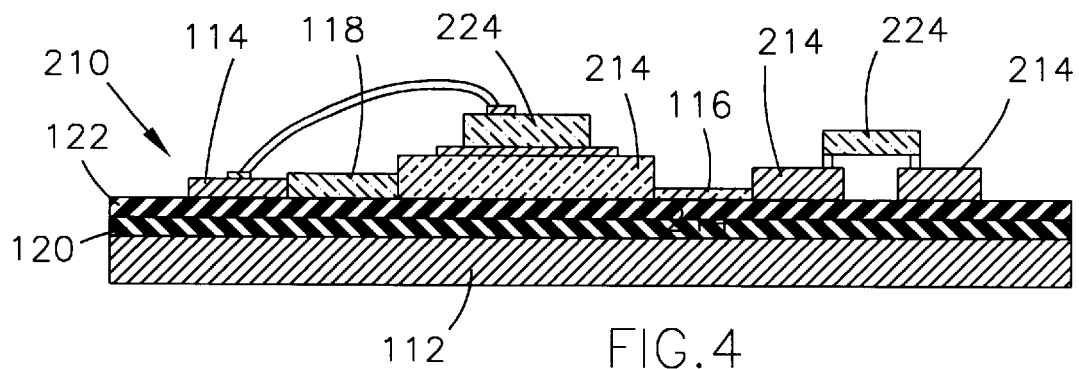

The thermal resistance of a circuit on a stainless steel substrate can be further reduced by the use of ultra-thick thick film (UTTF) conductors, which conduct heat laterally within the circuit structure in accordance with U.S. Pat. Nos. 5,395,679 to Myers et al. and 5,527,627 to Lautzenhiser, both of which are commonly owned by the assignee of this invention. This embodiment of the invention is depicted in FIG. 4, which shows UTTF conductors 214 beneath the circuit components 224.

Figure 5:
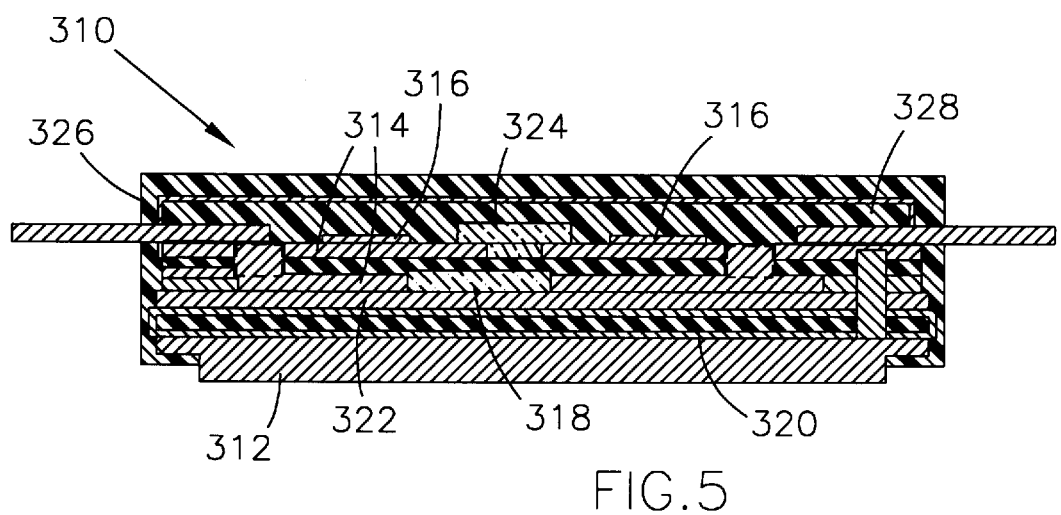
Figure 6:
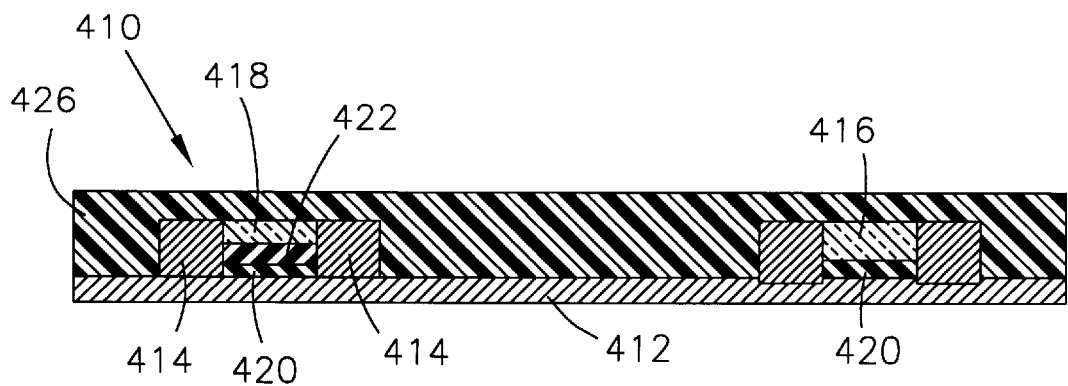

Also within the scope of this invention is a complex hybrid circuit structure 310 depicted in FIG. 5. The circuit structure 310 is rendered physically robust by a stainless steel substrate 312 to withstand the physical rigors of post-molding of a molding compound 326 that encapsulates a passivation gel 328, the insulator layer 320, interface layer 322, passive circuit elements 314, 316 and 318, and circuit components 324 on the steel substrate 312 in accordance with this invention. Alternatively, the steel substrate can be formed as a foil 412 as depicted in FIG. 6, which is then laminated to an organic insulator layer 426, such as the FR4 substrate material commercially available from various sources, to embed thick-film conductors 414, resistor 416 and capacitor 418 formed of conventional inorganic thick-film materials on the insulating coating 420 and interface layer 422 of this invention. The stainless steel foil 412 may be etched away to leave an organic circuit structure that can be laminated to a cooper foil, which in turn is etched to produce the circuit pattern 428 and structure represented in FIG. 7.

Yet another embodiment integrated with organic materials is shown in FIG. 8, in which an organic insulator (e.g., FR4) laminate 526 with a patterned conductor layer 528 has been laminated to a thick-film circuit on a steel substrate 512, which includes an insulating coating 520, interface layer 522, and inorganic thick-film circuit elements 514, 516 and 518 of this invention. The conductor layer 528 is shown electrically connected to the thick-film circuit with vias 530. Circuit components 524 are then mounted to the patterned conductor layer 528 in accordance with conventional practice.

Another embodiment by which the teachings of this invention can be integrated with organic circuit board structures is depicted in FIG. 9, in which a laminate formed by a ceramic-filled polymer dielectric layer 626 and a copper circuit layer 628 is laminated to a thick-film circuit on a steel substrate 612. As with the embodiment of FIG. 8, the thick-film circuit includes an insulating coating 620, interface layer 622, and inorganic thick-film circuit elements 614, 616 and 618 of this invention. Circuit components 624 mounted to the circuit layer 628 are shown electrically connected to the conductors 614 of the thick-film circuit with vias 630.

While our invention has been described in terms of a preferred embodiment, other forms could be adopted by one skilled in the art. Accordingly, the scope of our invention is to be limited only by the following claims.

What is claimed is:

1. A method of forming a circuit structure, the method comprising the steps of:
    providing a metal substrate;
    forming an inorganic electrical-insulator layer on the substrate;
    forming an interface layer on the electrical-insulator layer, the interface layer having a composition comprising a dispersion of particulate ceramic materials in a glass matrix;
    forming a thick-film passive circuit element on the interface layer; and then
    firing the circuit element, during which time at least a portion of the particulate ceramic materials remains as a dispersion of particles in the glass matrix:
    wherein the interface layer separates the circuit element from the electrical-insulator layer and inhibits diffusion into the circuit element of constituents in the electrical-insulator layer.

2. A method as recited in claim 1, wherein the particulate ceramic materials of the interface layer are a mixture comprising alumina, silica, zinc oxide and zirconia.

3. A method as recited in claim 1, wherein the glass matrix of the interface layer comprises barium oxide, silica, boric acid and alumina.

4. A method as recited in claim 1, wherein the interface layer has a CTE approximately equal to that of the circuit element.

5. A method as recited in claim 1, wherein the interface layer contains, in weight percent, about 25% to about 50% of the particulate ceramic materials, the balance being essentially the glass matrix.

6. A method as recited in claim 1, wherein the electrical-insulator layer has a composition comprising metal oxides of zirconium, titanium, copper, manganese, cobalt, zinc, calcium and strontium, and has a CTE approximately equal to that of the substrate.

7. A method as recited in claim 1, wherein the substrate is a stainless steel alloy.

8. A method as recited in claim 1, wherein the circuit element is formed to be an inorganic thick-film resistor.

9. A method as recited in claim 1, wherein the circuit element is formed to be a capacitor having an inorganic thick-film capacitor dielectric.

10. A method as recited in claim 1, further comprising the step of forming a thermal conductor on the interface layer, the thermal conductor being a single thick-film conductor layer having a thickness of at least 125 micrometers.

11. A method as recited in claim 1, wherein the circuit element, the interface layer and the electrical-insulator layer are each formed of inorganic thick-film materials.

12. A method as recited in claim 1, further comprising the steps of:
    laminating an organic insulator layer to the interface layer and over the circuit element, the organic insulator layer comprising a patterned conductor layer;
    electrically connecting the patterned conductor layer to the circuit element with a via; and then
    mounting a circuit component to the patterned conductor layer.

13. A method as recited in claim 1, further comprising the steps of:
    laminating a ceramic-filled polymer dielectric layer to the interface layer and over the circuit element, the ceramic-filled polymer dielectric layer comprising a circuit layer;
    electrically connecting the circuit layer to the circuit element with a via; and then
    mounting a circuit component to the patterned conductor layer.

14. A method as recited in claim 1, wherein at least one of the particulate ceramic materials is alumina particles.

15. A method as recited in claim 14, wherein during the firing step, the interface layer increases the melting point of a surface region of the electrical-insulator layer contacting the interface layer, and the alumina particles within the interface layer create an alumina glass-ceramic film in a surface region of the interface layer contacting the circuit element, while a remaining portion of the alumina particles remains as a dispersion of alumina particles in the glass matrix.

16. A method of forming a circuit structure, the method comprising the steps of:
    providing a metal substrate:
    forming an inorganic electrical-insulator layer on the substrate;
    forming an interface layer on the electrical-insulator layer, the interface layer having a composition comprising a dispersion of particulate ceramic materials in a glass matrix:
    forming a thick-film passive circuit element on the interface layer; and then
    encapsulating the passive circuit element, the interface layer and the electrical-insulator layer on the substrate with a molding compound;
    wherein the interface layer separates the circuit element from the electrical-insulator layer and inhibits diffusion into the circuit element of constituents in the electrical-insulator layer.

17. A method of forming a circuit structure, the method comprising the steps of:
    providing a metal substrate;
    forming an inorganic electrical-insulator layer on the substrate;
    forming an interface layer on the electrical-insulator layer, the interface layer having a composition comprising a dispersion of particulate ceramic materials in a glass matrix, at least one of the particulate ceramic materials being alumina particles;
    forming a thick-film passive circuit element on the interface layer; and then
    firing the circuit element, during which time the alumina particles within the interface layer create an alumina glass-ceramic film in a surface region of the interface layer contacting the circuit element, while a remaining portion of the alumina particles remains as a dispersion of alumina particles in the glass matrix;
    wherein the interface layer separates the circuit element from the electrical-insulator layer and inhibits diffusion into the circuit element of constituents in the electrical-insulator layer.

18. A method of forming a circuit structure, the method comprising the steps of:
    providing a metal foil;
    forming an inorganic electrical-insulator layer on the foil;

forming an interface layer on the electrical-insulator layer, the interface layer having a composition comprising a dispersion of particulate ceramic materials in a glass matrix;

forming a thick-film passive circuit element on the interface layer; and then forming an organic insulator layer on the interface layer;

wherein the interface layer separates the circuit element from the electrical-insulator layer and inhibits diffusion into the circuit element of constituents in the electrical-insulator layer.

19. A method as recited in claim 18, wherein the foil is laminated to the organic insulator layer so as to bury the passive circuit element, the method further comprising the steps of:

removing the foil by etching;

laminating the organic insulator layer to a copper foil; and then etching the copper foil to produce a conductor pattern on the organic insulator layer.

* * * * *